(12) United States Patent
Crist et al.

(10) Patent No.: US 6,879,940 B1
(45) Date of Patent: Apr. 12, 2005

(54) METHOD AND APPARATUS FOR REMOTELY TESTING SEMICONDUCTORS

(75) Inventors: Fredrick W. Crist, Nashua, NH (US); Timothy J. Wagner, Prunedale, CA (US)

(73) Assignee: Credence Systems Corporation, Milpitas, CA (US)

( * ) Notice: Subject to any disclaimer, the term of this patent is extended or adjusted under 35 U.S.C. 154(b) by 374 days.

(21) Appl. No.: 09/676,292

(22) Filed: Sep. 28, 2000

(51) Int. Cl.[7] ............................................. G06F 19/00
(52) U.S. Cl. ..................................................... 702/188
(58) Field of Search ........................... 438/14; 702/122, 702/188; 714/724

(56) References Cited

U.S. PATENT DOCUMENTS 6,236,952 B1    5/2001   Jun et al. .................... 702/119

FOREIGN PATENT DOCUMENTS

| JP | 06-120316 | 4/1994 |
| JP | 10-256109 | 9/1998 |
| JP | 11-015520 | 1/1999 |
| JP | 2000-077290 | 3/2000 |
| WO | WO 00/48075 | 8/2000 |

OTHER PUBLICATIONS

IEEE 100, The Authoritative Dictionary of IEEE Standards Terms, IEEE Press, 2000, pp. 397, 625, 633, 993, 1015, 1133, 1279 1285.*

Downloaded description of "Webtrends Firewall Suite 3.0" from www.softsolutions.co.nz/p0001557.htm, author unknown, dated Aug. 2000.*

Schlumberger Connectivity Center Service Description, Version [1.6], dated Nov. 23, 1998, 20 pages.

Copy of slide presentation entitled "SABER Integrate/Operate/Transfer Solution", given by Schlumberger, dated Mar. 23, 2000, 3 pages.

Schlumberger Publication, SABER Connectivity Solutions Service Description, Version 1.2, dated Apr. 26, 2000, 16 pages.

Schlumberger Specification Sheet, "IDS 10000da, E–Beam probe system for IC design analysis", dated Sep. 1999, 2 pages.

Schlumberger Specification Sheet," ITS 9000KX, The industry's most accurate VLSI test system for highest yields and throughput", dated Jul. 1999, 2 pages.

M. Bertocco, F. Ferraris, C. Offelli, M. Parvis, "A Client Server Architecture for Distributed Measurement Systems" IEEE Instrumentation and Measurement Technology Conference, May 18–21, 1998 pp. 67–72.

F. Algeria and H.G. Ramos, "A Remote Controlled Automated Measurement System" IEEE Instrumentation and Measurement Technology Conference, May 19–21, 1997, 2 pages.

J. Kondo, S. Bose, D. Adduci, "A Real Time Process Control System for IC Testing" Northwest IC Division, 1991, pp. 331–338.

European Search Report, dated Mar. 7, 2002, 3 pages.

* cited by examiner

*Primary Examiner*—Evan Pert
(74) *Attorney, Agent, or Firm*—Dorsey & Whitney LLP

(57) ABSTRACT

An apparatus is disclosed for remotely monitoring and developing steps in a semiconductor manufacturing process that includes, at least one remote workstation connected via a remote access link to a local workstation, and a test system connected via a link to the local workstation. A method is also disclosed that includes running a semiconductor test system remotely, monitoring the semiconductor test system remotely, and receiving data from the semiconductor test system remotely. Another embodiment includes an apparatus for remotely monitoring and developing steps in a semiconductor manufacturing process. This embodiment includes a plurality of remote workstations each connected via a remote access link to a local workstation, and a test system connected via a link to a local workstation. Security features in this embodiment prevent any one remote workstation from accessing any other remote workstation.

27 Claims, 3 Drawing Sheets

FIG. 1 - Prior Art

METHOD AND APPARATUS FOR REMOTELY TESTING SEMICONDUCTORS

BACKGROUND OF THE INVENTION

1. Field of the Invention

The invention relates generally to the field of integrated circuit design and manufacturing. More specifically, the invention relates to systems for testing integrated circuit designs and chips from a location remote from physical testing equipment.

2. Description of the Related Art

Because of increasing complexity of newly developed integrated circuits, new types of integrated circuit manufacturing techniques have been developed. Currently, integrated circuit manufacturers commonly use one of several possible approaches to make their products. First, a manufacturer can build and run its own factories to make the semiconductors themselves. These factories are known as semiconductor foundries or fabrication plants. Some companies only operate such fabrication plants, leaving other steps in the development of new integrated circuits to others. A number of large companies, known as "integrated device manufacturers" (IDMs) have both the ability to design and test new semiconductors. IDMs also own their own fabrication plants. Alternatively, a company can restrict itself to designing integrated circuits that ultimately are then produced by another. Traditionally, it was common for a manufacturer to be an IDM. A number of fabrication plants, or "fabs", were built by such IDMs. In order to save capital and operating expenses, the owners of "fabs" sometimes built plants in lower-cost countries. Typically, however, the "fabs" themselves possessed very little capability for semiconductor design. As a result, some companies have begun to appear whose sole concern is to design integrated circuits. These design companies, which may have no manufacturing or testing capability, typically contract out the testing and production of integrated circuits to others. Many smaller companies often have no capabilities beyond the initial design of integrated circuits. All the intermediate steps between initial design and production are contracted out to third parties. These design-only companies are referred to as "fabless" firms. Fabless firms generally have a need for testing services to be provided by third parties. However, the fabless firm also has a need to remain closely involved with testing steps that take place prior to "hand off" of the integrated circuit design to volume manufacturing due to the fact that the circuit design may undergo a number of changes during the development process.

There are many intermediate steps between the conceptual development and the actual volume production of a new integrated circuit. The first step in bringing a new design to the production stage is the initial design. In the initial design, a design engineer, using an end user's specifications, develops a series of logical gates that the design engineer believes will produce the end user's specified functionality in a completed integrated circuit. At this stage, the design engineer produces only an arrangement of logical elements, and typically does not physically construct any device.

The next step is testing the initial design to determine if the integrated circuit will produce the user's specified functionality. At this stage, the testing generally involves simulating the arrangement of logic gates on a computer, and determining the actual functionality of the logic gates so arranged. Changes to the arrangement of logic gates can be performed on the simulation computer to rectify any deficiency in producing the user's specified functionality. The testing and design is then repeated until the logical design meets the user's desired specifications. This re-testing and re-designing cycle is known as debugging. Debugging typically only includes rearranging the simulated or theoretical gates to produce the desired functionality. The testing, at this stage, is typically not rigorous and serves only to confirm that the logic gates are arranged in a proper fashion.

The next step of the integrated circuit development process is fabricating prototype devices, this being referred to in the art as "first silicon". This prototype device is then tested, typically more rigorously than the simulated device, in a next step known as design debug. Because of the difficulties in reproducing a theoretical series of logic gates in three-dimensions on a silicon wafer, errors commonly arise in making first the prototype device. For example, the timing of two signals to a particular gate may be such that the desired data does not pass through the gate as expected. Therefore, the next step in the development process is to debug and possibly repair the prototype device. In order to repair the prototype device, the individual gates are evaluated and repaired as necessary to produce the end user's functionality. The gates in the prototype device are physically observed and/or repaired, by using instruments such as an "electron beam" (e-beam) probe system, an "infrared laser" (optical) probe system or a "focused ion beam" (FIB) probe system. One such e-beam machine is known by model number IDS $10000_{da}$. One such infrared laser probe system is known by model number IDS 2000. One such focused ion beam probe system is known by model number IDS P3X. All of the preceding instruments are sold by Schlumberger Semiconductor Solutions, San Jose, Calif. To repair a gate that is inoperative or not working as planned, the FIB machine can literally "burn" a hole into the prototype device, for example, cutting a wire leading to an inoperative gate. After the inoperative gate is disconnected, a new element, such as a jumper, can be put in place by the FIB probe system. After all the repairs have been made, the prototype device is re-tested until the logical elements produce the end user's desired functionality.

The next step in the process is characterization of the prototype device. The characterization step generally includes a full-scale performance test of the device. The performance test includes, for example, a determination of the actual maximum operating speed, the voltages at inputs and outputs, timing parameters and temperature limitations. If the prototype device passes the characterization test it can be "handed off" to a fabrication plant for volume manufacturing. Once the device design is delivered to the fabrication plant, test programs must be designed to test the product produced by the fabrication plant. Because every circuit design has different user specifications and different internal logical elements, new test programs must be developed for each design of device produced. The typical fabless firm may specify the test program, or the fabless firm may leave the development and implementation of test programs, either during design debug, characterization, or volume manufacturing testing to an outside company.

"Test houses" exist in the industry whose sole functions are to develop test programs and/or to perform the actual testing at the various stages of integrated circuit development. Some fabrication plants will carry out the physical testing but will not develop the test program (which may include software, test interfaces, etc.), relying instead on a test house or other entity to design the test program. The testing is carried out for the duration of the production cycle of any particular circuit design. At this point, an integrated circuit is generally ready to be sold to end users.

FIG. 1 shows a typical method that a fabless firm, for example, uses to develop a new integrated circuit from an initial design to an end product. A fabless firm 20 first designs 1 the logical arrangement of circuit elements in a proposed integrated circuit. The fabless firm 20 will simulate 2 the integrated circuit to determine whether it will function as intended. Any changes to the design 1 determined to be necessary during simulation 2 are included in the design 1 at this time. Next, the fabless firm 20 will generate a layout 3 for the integrated circuit. The completion of the layout is known in the art as "tape out". The layout is sent to the fabrication plant 30 where a prototype will be fabricated 4. The fabrication plant 30 may itself then either debug 5A and characterize 7B the prototype or may send the prototype out for debug 5A and characterization 7B to a test house 40. Based on test results obtained during design debug 5A the fabrication plant 30 or test host 40 may modify the design 7A or a new prototype may have to be created. After determining that the prototype functions as intended, volume manufacturing of the integrated circuit can begin. Test and assembly 5B of the product made by the fabrication plant 30 may be performed by the test house 40, and the results of those tests are communicated to the fabless manufacturer 20 and the fabrication plant 30 to remedy any design and/or production flaws found during volume manufacture. Finally, the completed integrated circuits can be shipped 6 to the end user.

Because of all of the steps involved in bringing a new integrated circuit design to market, i.e., design step, repair/debug steps, and testing step, producing a new integrated circuit is difficult and expensive. Monitoring the development of the integrated circuit throughout the various stages is also a difficult task, particularly for the fabless firm who must generally contract testing to third parties.

Monitoring involves reviewing and analyzing test results and test data as they become available. For example, a fabless firm would be interested in viewing the test results on integrated circuit performance to determine if any design changes are needed, and the effect of any such design changes. Because monitoring is difficult, preventable errors in design, assembly, or other stages may not be avoided. Additionally, a fabless firm may wish to run a test program itself to speed up the review of test data, but may not have the required resources. In such a case, a fabless firm may be forced to either outsource the testing or to use the facilities of a test house.

SUMMARY OF THE INVENTION

In one aspect the invention relates to an apparatus for remotely monitoring and developing steps in a semiconductor manufacturing process. The apparatus according to this aspect of the invention includes at least one remote workstation connected via a remote access link to a local workstation, and a test system connected via a link to the local workstation.

In another aspect, the invention relates to a method for remotely monitoring and developing steps in semiconductor manufacturing. The method according to this aspect of the invention includes running a semiconductor test system remotely, monitoring the semiconductor test system remotely, and receiving data from the semiconductor test system remotely.

In another aspect, the invention relates to an apparatus for remotely monitoring and developing steps in a semiconductor manufacturing process that includes a plurality of remote workstations each connected via a remote access link to a local workstation, and a test system connected via a link to a local workstation.

Other aspects and advantages of the invention will be apparent from the following description and the appended claims.

DETAILED DESCRIPTION

In order to speed development and reduce cost in semiconductor manufacturing, companies such as fabless firms may desire the ability to remotely monitor (such as at their own physical facilities), analyze, and run integrated circuit test programs during the design, debug and production phases of making a new integrated circuit.

A test system is generally provided by a "host" that controls (i.e. owns or leases) equipment required for the test system. The host may be an entity known in the art as a "test house", or may be a part of an integrated device manufacturer that offers testing services to others, these others including, for example, fabless firms. The test system may be any machine or machines and any associated ancillary equipment used in semiconductor circuit testing. For example, one such testing machine is sold under model number ITS 9000KX, by Schlumberger Semiconductor Solutions, San Jose, Calif. This test machine advantageously has a high throughput, and maintains a high level of accuracy, so that a large number of semiconductor circuits may be tested quickly. Ancillary equipment may include, for example, a wafer prober, a device handler, or a temperature forcing unit. Additionally, the test system comprises computer hardware and software that run the test machine. The types of computer hardware, software, and test systems available in semiconductor testing are known in the art, and are not intended to limit the scope of the invention. A "client" is an entity wishing to use the host test system. Exemplary clients are fabless firms, IDMs, or fabrication plants (which may not desire to do their own testing). The term "host network" is used to describe a local area network (LAN), or intranet, of the host. Similarly, the term "client network" is used to describe a local area network (LAN), or intranet, of the client. The present invention allows a client to monitor, and/or perform directly, testing on an integrated circuit where the test machine is located in a separate physical facility. Typically, but not exclusively, the test machine will be located at the host's physical facility.

Figure 1:
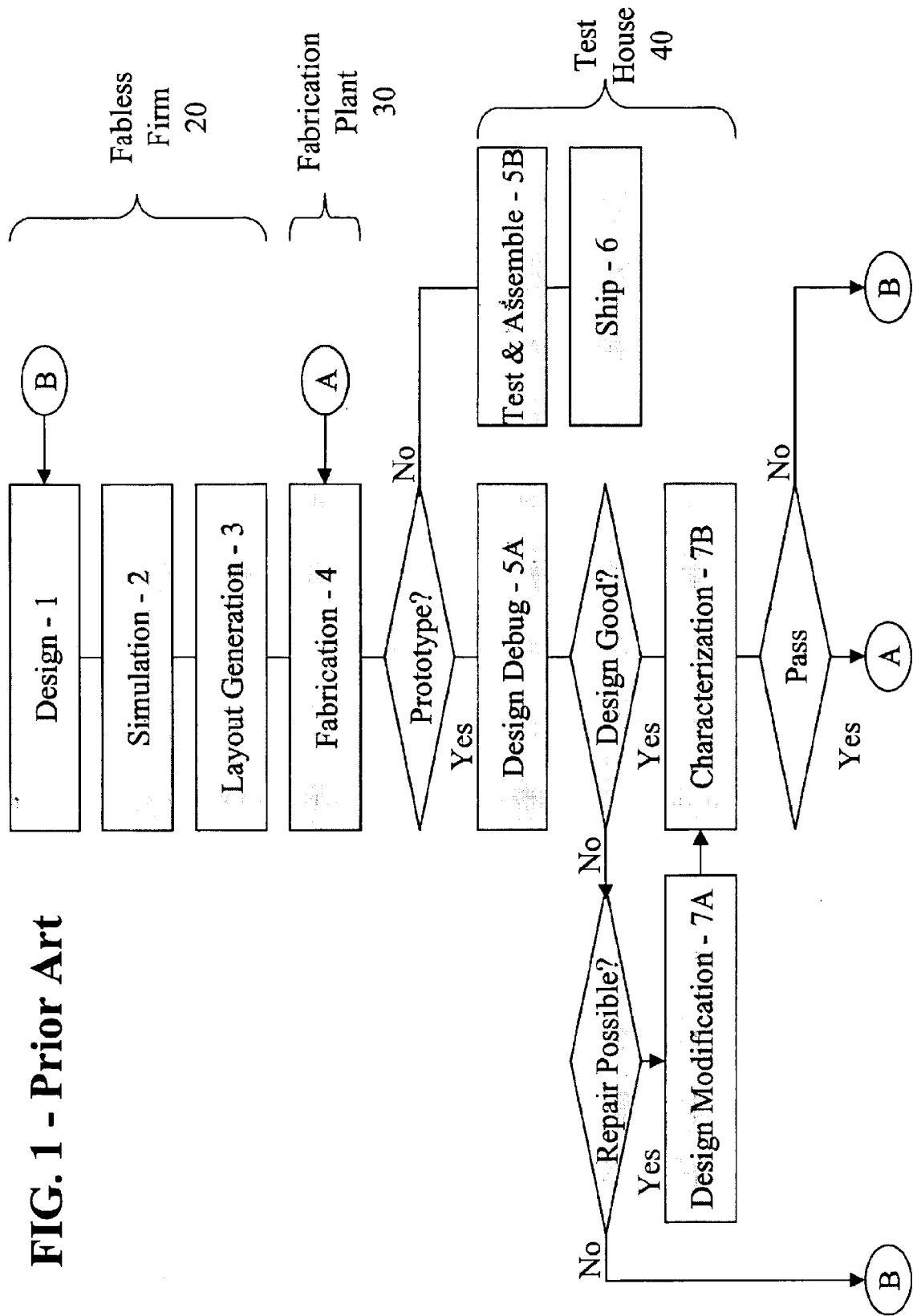
FIG. 1 is a prior art illustration of the steps in semiconductor manufacturing.
Figure 2:
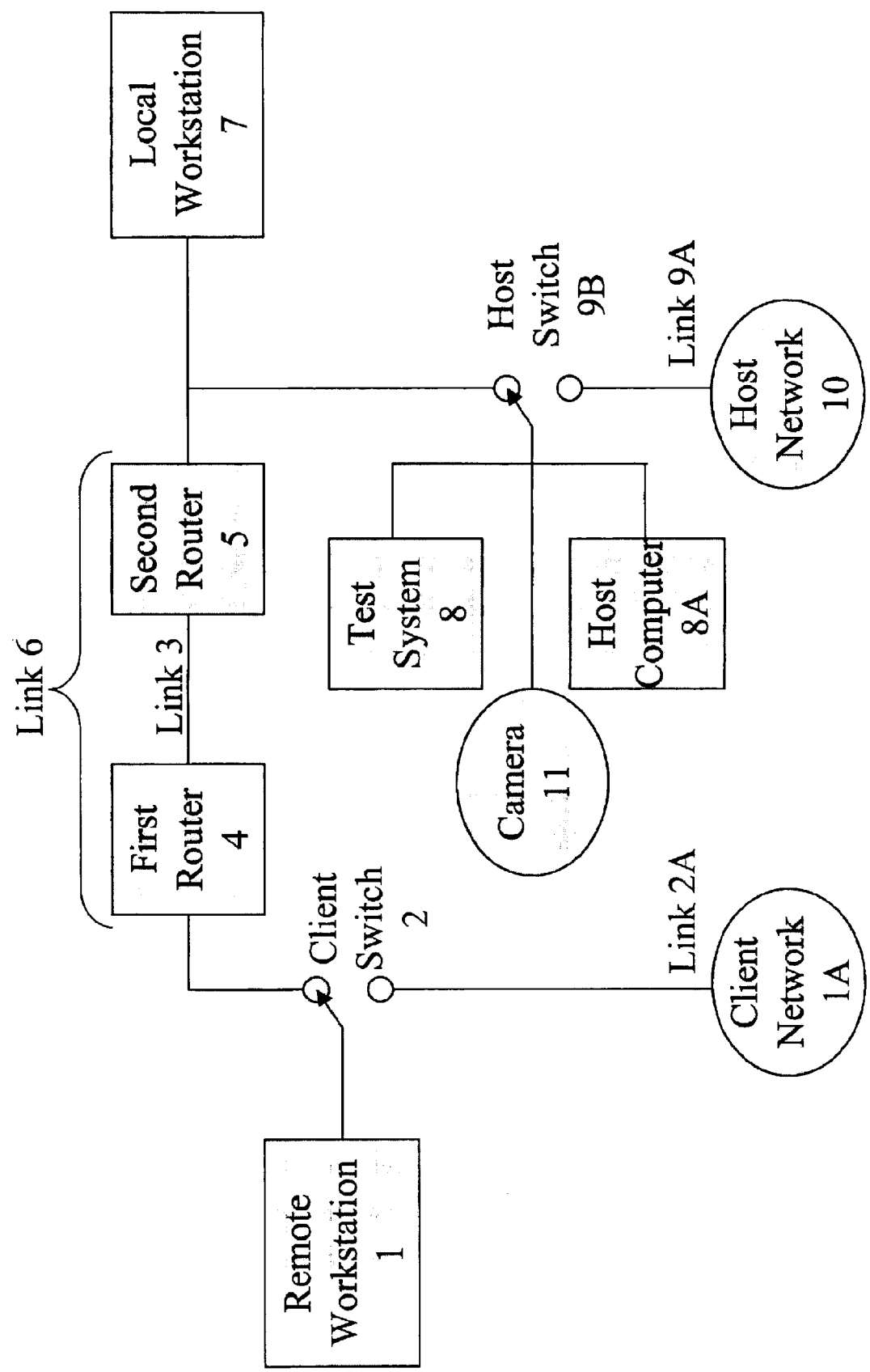
FIG. 2 is an overview of an embodiment of the invention.

FIG. 2 provides a specific example of one embodiment of the invention. FIG. 2 illustrates the development of a test program which may be used on the previously described ITS 9000 test system 8. In this example, a remote workstation 1 is installed at a client location. The remote workstation 1 typically will have software thereon required in order for the client to develop a test program for the device under test (DUT). The system of this embodiment of the invention may include a client switch 2, which is controlled by the client. The client switch 2 enables the client to connect the remote workstation 1, via a link 2A, to a client network 1A. The client switch 2 can connect the remote workstation 1 to the client network 1A, via a link 2A, or the client switch 2 can alternatively connect the remote workstation 1 to a first router 4. The client, in some instances, may wish to connect the remote workstation 1 to the client network 1A to facilitate transfer of a test program or data resident on other computers (not shown) at the client's physical facility, to the remote workstation 1. The nature of the client switch 2 is not intended to limit the scope of the invention, and, moreover, the client may decide whether such a switch is desirable.

The first router 4 connects the remote workstation 1, via a link 3, to a second router 5. The first router 4, second router 5 and the link 3 comprise a "remote access link" 6 which ultimately links the remote workstation 1 to a local workstation 7. In this embodiment, the first router 4 and the second router 5 are ISDN routers, sold under Model number 776, by Cisco Systems Inc., of San Jose, Calif. Two routers are shown in this embodiment, but more than two routers may be present. The link 3, connecting the first router 4 and the second router 5 is an Integrated Services Digital Network (ISDN) dial-up link, in this embodiment. However, the remote access link 6 can be made up of other components, comprising, what is known in the art, as wide area network (WAN) technology. In addition to ISDN, other examples of WAN technology include frame relay, fractional T1, T1, E1, T3, and Asynchronous Transfer Mode (ATM). Another example of WAN technology is a virtual private network (VPN). The virtual private network enables information to be sent over a network, such as the internet, from one computer to another while maintaining security by encrypting the information. When economy is a driving factor, standard modem links may also be used for link 6. While slow for transferring large amounts of data, a modem link would enable a client to operate the test system 8 remotely. The remote workstation 1 and the local workstation 7 in this embodiment are UNIX-based workstations sold under the model name "Ultra 5", by Sun Microsystems, Inc., of Palo Alto, Calif.

The test program must at some point in time be transferred to the local workstation 7 in order to run the test system 8 from the local workstation 7. In this embodiment, the test system 8 is connected to the host's network 10 (LAN). The local workstation 7 is desirable because of the large quantity of data that must be transferred to and from the test system 8. However, in theory, the remote workstation 1 could be operatively connected to the test system 8 (such as by link 6) without using the local workstation 7. The test system 8 may be connected to the host network 10 via a link 9A. The link 9A, however, is not a direct link, in order to prevent a client from accessing the host network 10 through the local workstation 7. Instead, a host switch 9B may be provided, that the host can operate. The host switch 9B allows the host to access the test system 8 as needed, without the client having access to the host network 10. The host switch 9B may be a physical switch, or may be a computer controlled switch such as an ethernet switch. Alternatively, the host switch 9B may be a computer controlled switch operated by security software such as is commercially available under the trade name Schlumberger Connectivity Center (SCC) by OMNES, Schlumberger Ltd., Houston, Tex. When using the security software, the host network 10 functions as a virtual private network. In such a case, a plurality of clients can have information stored on local workstations 7, but will be prevented by firewalls from accessing any information other than their own. The type of switch used is not intended to limit the scope of the invention. When the host selectively operates the host switch 9B, to connect the test system 8 to the host network 10, the client is prevented from accessing the test system 8. However, the host may access the test system 8 as needed. The host may re-enable the client to remotely access the test system 8, by selectively operating the host switch 9B.

After the test program is transferred to the local workstation 7 via the remote access link 6, the local workstation 7 contains the test program. Transfer of the test program over the remote access link 6 may be time consuming, so it is also possible that the client may wish to transfer the test program onto the local workstation 7 using physical media, such as magnetic tape or a CD-ROM, for example. Once the local workstation 7 contains the test program, the client may arrange for a selected time on the test system 8 to operate and monitor testing of the DUT. When the scheduled time arrives, the host grants access to the test system 8, generally by selective operation of the host switch 9B. The test system 8 can then be rebooted from the operating system resident on the local workstation 7. The client may then access the test system 8 remotely, via the remote access link 6. Because the remote workstation 1 and the local workstation 7 may be linked, the client can run the local workstation 7 as if the client where physically present at the host's facilities. Additionally, if the client desires, employees of the host may be connected via a host computer 8A linked to the test system 8. The host computer 8A or local workstation 7 may have collaboration software installed, to allow the client to have real-time assistance from host employees while running the test system 8. The client can request assistance by conventional means such as over a phone line, or it may be computer generated. The computer generated assistance request may be sent to the host computer 8A or local workstation 7 to alert the host that assistance is needed. If assistance is required, the host may access via the host computer 8A or by accessing the local workstation 7, and provide any technical assistance required. In addition, a networked camera 11 may be linked to the test system 8 so that the client can watch the test system 8 as it functions. The networked camera 11 allows the client to monitor the test system 8 while in operation. Additionally, the host can install ancillary equipment, depending on the clients need. For example, a temperature forcing unit, a wafer prober, and/or a device handler may be added.

Note that during the time when the client is denied access to the test system 8, the host may operate the test system for his own purposes, such as providing testing services to entities other than the client. In one example, the host may be an IDM who is testing his own circuit designs during periods of time when client access to the test system 8 is denied. In another example, the host may test circuit designs locally for other clients who do not desire remote access to the test system 8.

The invention is not limited to operation and monitoring of integrated circuit first silicon test programs. For example, a similar system may be for design debug of the integrated circuit. In this example, the test system 8 of the previous embodiment is substituted by a probe system, discussed previously.

In another example, a system similar to the first embodiment of the invention may be used by a fabrication plant to monitor and test the assembled semiconductors.

Figure 3:
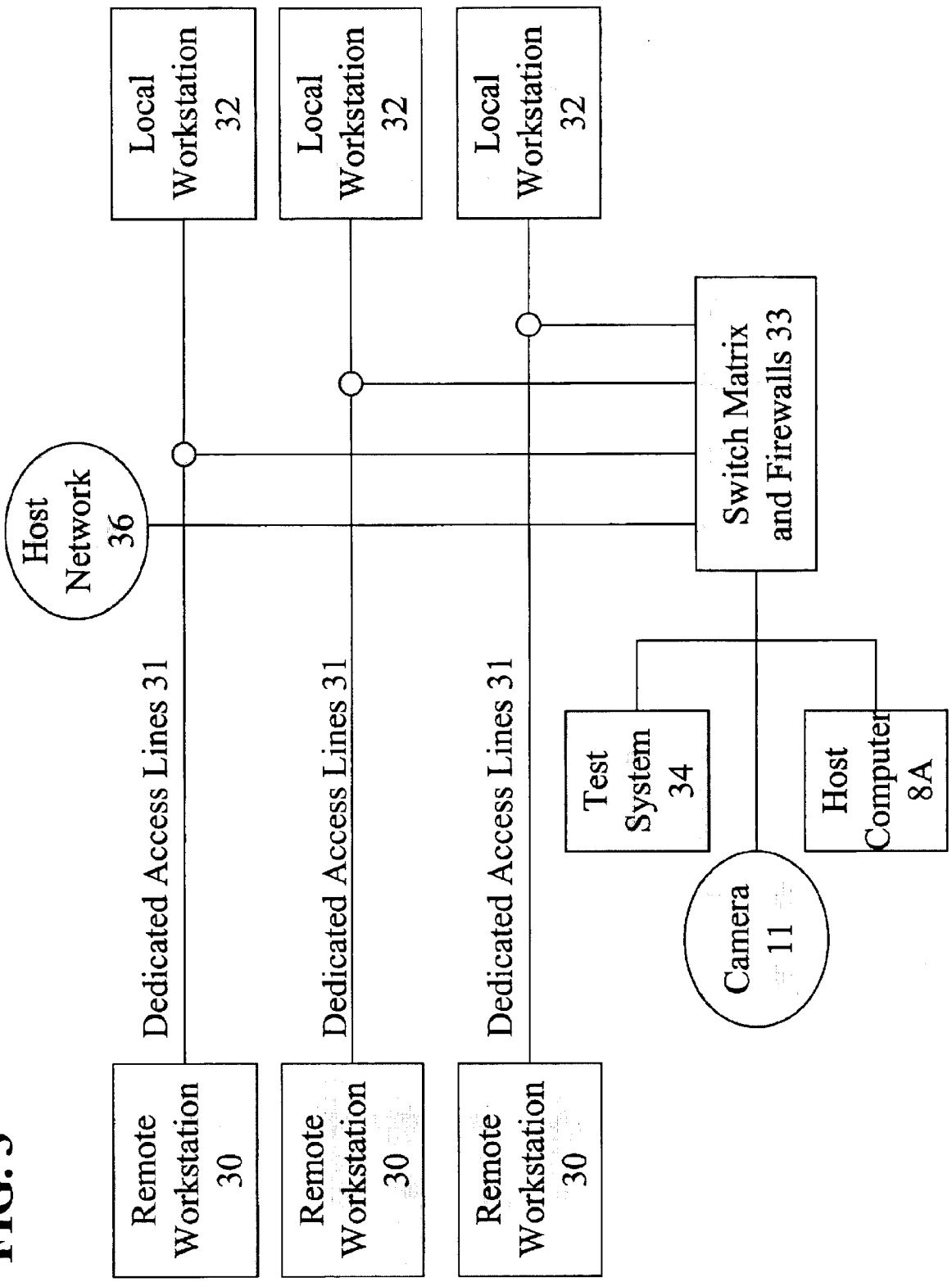
FIG. 3 is an overview of an embodiment of the invention.

FIG. 3 illustrates an alternative embodiment of the invention, where multiple clients may desire to have remote access and control over a test system. In FIG. 3, each client will have its own separate local workstation, a plurality of remote workstations 30 each has a remote access line 31. In the example embodiment of FIG. 3, each remote access line is substantially the same as the link (6 in FIG. 2) in the first embodiment. Each line 31 connects its corresponding remote workstation(s) 30 to the client's local workstation 32. The local workstations 32 are generally in the same physical facility as the test system (as in the first embodiment). The data and test programs for each of the individual clients are typically separated by a series of firewalls 33. The firewalls 33 create secure enclaves for an individual client's data and test programs. When a particular client has scheduled time on the test system 34 all other clients are prevented from accessing the test system 34, ensuring maximum security for the particular client. Additionally, the particular client may only connect to their local workstation 32 after being screened by the host's security system. Any intrusion into local workstation 32 is immediately recorded and ticketed for further follow up by the host. The host schedules particular times on the test system 34 for particular single clients, who may then operate the test system 34 as described in the first embodiment. A switch matrix 33, is provided so that a host network 36 may connect or disconnect from the test system 34 as described in the previous embodiment.

Those skilled in the art will appreciate that other embodiments of the invention can be devised which do not depart from the spirit of the invention as disclosed herein. Accordingly, the scope of the invention shall be limited only by the attached claims.

What is claimed is:

1. An apparatus for remotely monitoring and developing steps in a semiconductor manufacturing process comprising:
   at least one remote workstation connected via a remote access link to a local workstation; and
   a test system connected via a link to the local workstation, wherein the test system comprises ancillary equipment pre-selected and operatively controlled by a client to test various functions of a device.

2. The apparatus of claim 1, further comprising a client switch that connects a client network to the at least one remote workstation.

3. The apparatus of claim 1, further comprising a host switch that connects a host network to the test system and when engaged, prevents client access to the test system.

4. The apparatus of claim 3, wherein the host switch comprises a manual switch.

5. The apparatus of claim 3, wherein the host switch comprises an ethernet switch.

6. The apparatus of claim 3, wherein the host switch comprises a computer security software.

7. The apparatus of claim 1, wherein the remote access link comprises:
   a wide area network communication line operatively coupling the local workstation to the remote workstation.

8. The apparatus of claim 7, wherein the remote access link further comprises at least one router.

9. The apparatus of claim 1, wherein the link comprises a Local Area Network including the local workstation and the test system.

10. The apparatus of claim 1, wherein the ancillary equipment further comprises a temperature forcing unit.

11. The apparatus of claim 1, wherein the ancillary equipment further comprises a wafer prober.

12. The apparatus of claim 1, wherein the ancillary equipment further comprises a device handler.

13. The apparatus of claim 1, further comprising:
   a video camera networked to the test system.

14. An apparatus for remotely monitoring and developing steps in a semiconductor manufacturing process comprising:
   a plurality of remote workstations each connected via a remote access link to a local workstation; and
   a test system connected via a link to the local workstation, wherein the test system comprises ancillary equipment pre-selected and operatively controlled by a client to test various functions of a device.

15. The apparatus of claim 14, wherein the local workstation includes a plurality of firewalls adapted to prevent access from one of the remote workstations to any other one of the remote workstations.

16. The apparatus of claim 14, wherein at least one of the remote access links comprises an internet connection.

17. The apparatus of claim 14, wherein at least one of the remote access links comprises a dedicated WAN technology.

18. The apparatus of claim 14, further comprising a host switch adapted to selectively connect a host networking service to the test system.

19. The apparatus of claim 14, wherein the ancillary equipment further comprises a temperature forcing unit.

20. The apparatus of claim 14, wherein the ancillary equipment further comprises a wafer prober.

21. The apparatus of claim 14, wherein the ancillary equipment further comprises a device handler.

22. A method for remotely monitoring and developing steps in semiconductor manufacturing comprising:
   running a semiconductor test system remotely from a remote workstation coupled over a link to a local workstation, the local workstation being operatively coupled to the test system;
   monitoring the semiconductor test system remotely from the remote workstation; and
   receiving data from the semiconductor test system at the remote workstation,
   wherein monitoring the semiconductor test system comprises using at least one piece of ancillary equipment.

23. The method of claim 22, wherein the semiconductor test system comprises a semiconductor probe system for integrated circuit design debug and repair.

24. The method of claim 22, wherein the semiconductor test system comprises a test system adapted to monitor the functionality of semiconductors produced by a fabrication plant.

25. The method of claim 22, further comprising:
   controlling the semiconductor test system remotely from the remote workstation.

26. An apparatus for remotely monitoring and developing steps in a semiconductor manufacturing process comprising:
   at least one remote workstation operatively connected via a Wide Area Network communication line to a local workstation;
   a test system connected via a Local Area Network to the local workstation; and
   a host network detachably connected by a host switch and a link to the test system,
   wherein the test system comprises ancillary equipment pre-selected and operatively controlled by a client to test various function of a device.

27. The apparatus of claim 26, further comprising a video camera networked to the test system.

* * * * *